United States Patent
Kim

(10) Patent No.: US 11,483,014 B2
(45) Date of Patent: *Oct. 25, 2022

(54) SYSTEM AND METHOD FOR SOFT DECODING WITHOUT ADDITIONAL READS

(71) Applicant: SK hynix Inc., Gyeonggi-do (KR)

(72) Inventor: Kyungjin Kim, San Jose, CA (US)

(73) Assignee: SK hynix Inc., Gyeonggi-do (KR)

(*) Notice: Subject to any disclaimer, the term of this patent is extended or adjusted under 35 U.S.C. 154(b) by 34 days.

This patent is subject to a terminal disclaimer.

(21) Appl. No.: 17/130,824

(22) Filed: Dec. 22, 2020

(65) Prior Publication Data

US 2022/0200633 A1   Jun. 23, 2022

(51) Int. Cl.
| | | |
|---|---|---|
| *H03M 13/45* | (2006.01) | |
| *G11C 16/34* | (2006.01) | |
| *G11C 16/26* | (2006.01) | |
| *G11C 16/04* | (2006.01) | |

(52) U.S. Cl.
CPC ......... *H03M 13/45* (2013.01); *G11C 16/0483* (2013.01); *G11C 16/26* (2013.01); *G11C 16/349* (2013.01)

(58) Field of Classification Search
None
See application file for complete search history.

(56) References Cited

U.S. PATENT DOCUMENTS

| | | | |
|---|---|---|---|
| 9,007,854 | B1 | 4/2015 | Nemati Anaraki et al. |
| 9,564,239 | B2 | 2/2017 | Cai et al. |
| 11,163,483 | B2* | 11/2021 | Kim ...................... G06F 3/0616 |
| 2016/0276039 | A1* | 9/2016 | Cai ..................... G11C 11/5642 |
| 2020/0210096 | A1 | 7/2020 | Kim et al. |

* cited by examiner

*Primary Examiner* — Guerrier Merant
(74) *Attorney, Agent, or Firm* — IP & T Group LLP

(57) ABSTRACT

A controller of a memory system performs a soft decoding without additional reads. The controller applies each of read voltages to cells to obtain a corresponding cell count and corresponding data, stores the obtained data, and processes the stored data. The controller determines a set of parameters, based on (i) the read voltages, (ii) cell counts corresponding to the read voltages and (iii) a non-negative regularization parameter. The controller estimates an optimal read voltage based on the set of parameters, generates log-likelihood ratio (LLR) values using the processed data and the optimal read voltage and performs soft decoding using the LLR values.

14 Claims, 14 Drawing Sheets

SYSTEM AND METHOD FOR SOFT DECODING WITHOUT ADDITIONAL READS

BACKGROUND

1. Field

Embodiments of the present disclosure relate to a scheme for performing a decoding to improve latency and error correction capability in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various schemes to improve latency and error correction capability.

SUMMARY

Aspects of the present invention include a system and a method for performing soft decoding without additional reads during an optimal read voltage search.

In one aspect, a memory system includes a memory device including a plurality cells and a controller. The controller is configured to: apply each of a plurality of read voltages to the plurality of cells to obtain a corresponding cell count and corresponding data; store the obtained data associated with the plurality of read voltages; process the stored data; determine a set of parameters, based on (i) the plurality of read voltages, (ii) the cell counts corresponding to the plurality of read voltages and (iii) a non-negative regularization parameter which is based on one or more properties of the memory device and is selected to reduce a variance of at least one parameter of the set of parameters; estimate an optimal read voltage based on the set of parameters; generate log-likelihood ratio (LLR) values using the processed data and the optimal read voltage; and perform soft decoding using the LLR values.

In another aspect, a method for operating a memory system, which includes a memory device including a plurality cells and a controller. The method includes: applying each of a plurality of read voltages to the plurality of cells to obtain a corresponding cell count and corresponding data; storing the obtained data associated with the plurality of read voltages; processing the stored data; determining a set of parameters, based on (i) the plurality of read voltages, (ii) the cell counts corresponding to the plurality of read voltages and (iii) a non-negative regularization parameter which is based on one or more properties of the memory device and is selected to reduce a variance of at least one parameter of the set of parameters; estimating an optimal read voltage based on the set of parameters; generating log-likelihood ratio (LLR) values using the processed data and the optimal read voltage; and performing soft decoding using the LLR values.

Additional aspects of the present invention will become apparent from the following description.

DETAILED DESCRIPTION

Figure 1A:
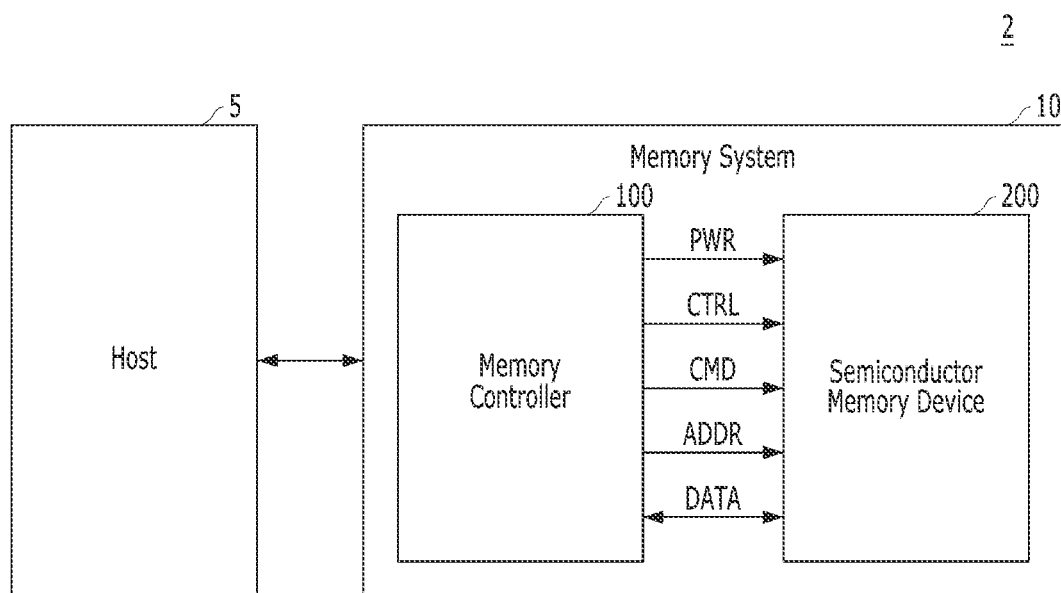
FIG. 1A is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1A is a block diagram illustrating a data processing system 2 in accordance with an embodiment of the present invention.

Referring FIG. 1A, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various kinds of storage devices such as a solid state drive (SSD) and/or a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1A) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 1B:
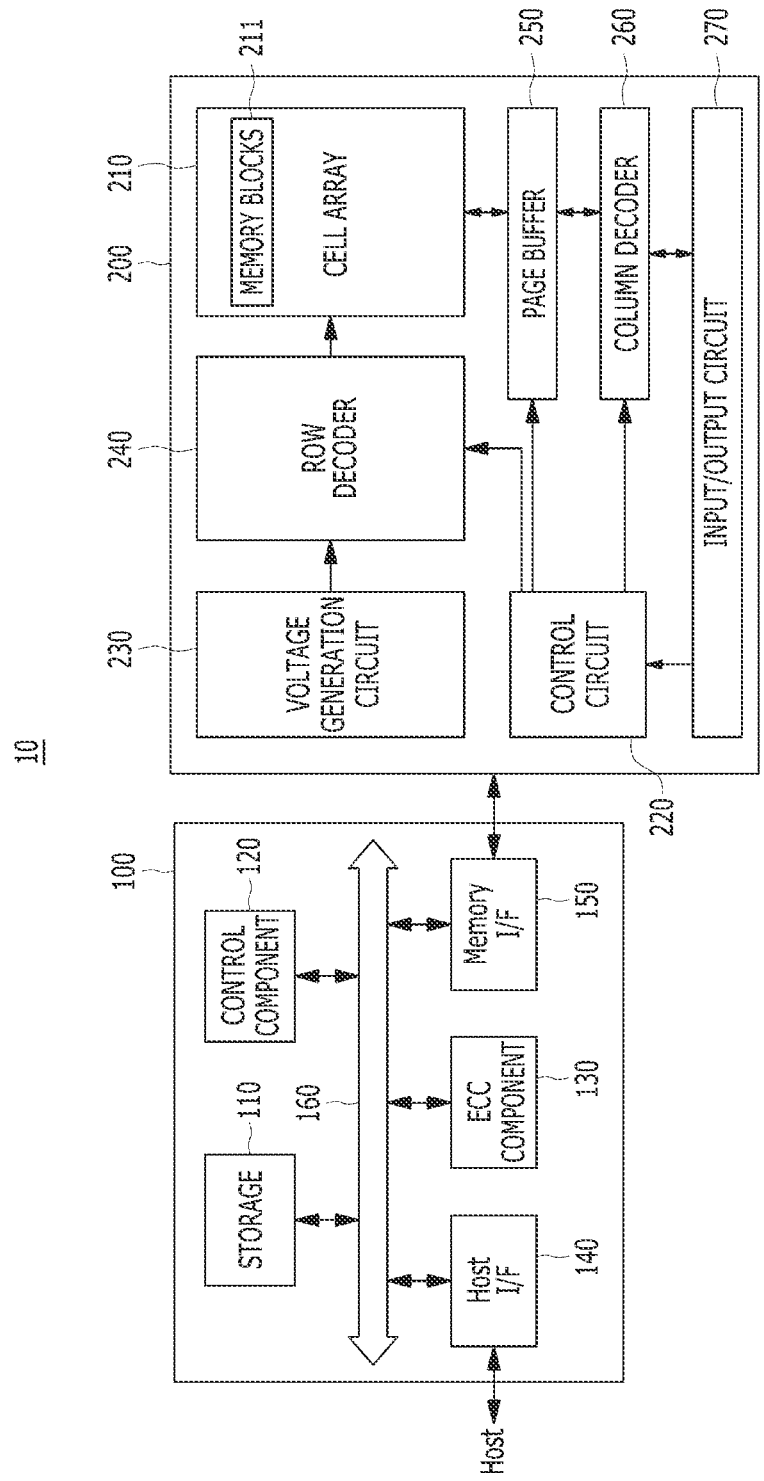
FIG. 1B is a block diagram illustrating a memory system in accordance with an embodiment of the present invention.

FIG. 1B is a block diagram illustrating a memory system in accordance with an embodiment of the present invention. For example, the memory system of FIG. 1B may depict the memory system 10 shown in FIG. 1A.

Referring to FIG. 1B, the memory system 10 may include a memory controller 100 and a semiconductor memory device 200. The memory system 10 may operate in response to a request from a host device (e.g., host device 5 of FIG. 1A), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request frown the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 2:
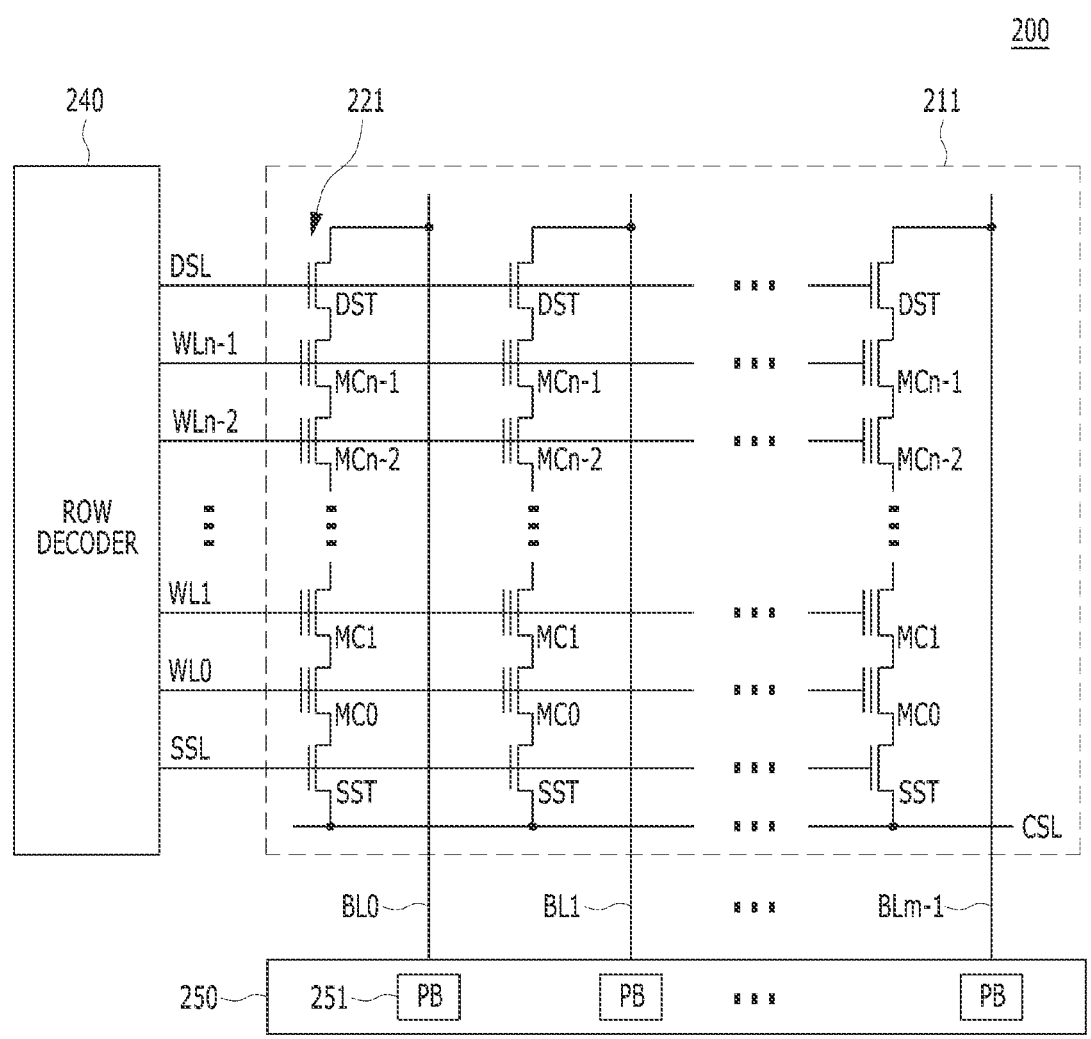
FIG. 2 is a circuit diagram illustrating a memory block of a memory device in accordance with an embodiment of the present invention.

The page buffer 250 may be coupled with the memory cell array 210 through bit lines BL (shown in FIG. 2). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1A), transmit data from the external device to the column decoder 260, or output data from the column decoder 260 to the external device, through the input/output circuit 270.

The control circuit 220 may control the peripheral circuit in response to the command and the address, FIG. 2 is a circuit diagram illustrating a memory block of a semiconductor memory device in accordance with an embodiment of the present invention. For example the memory block of FIG. 2 may be any of the memory blocks 211 of the memory cell array 210 shown in FIG. 1B.

Referring to FIG. 2, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 3A:
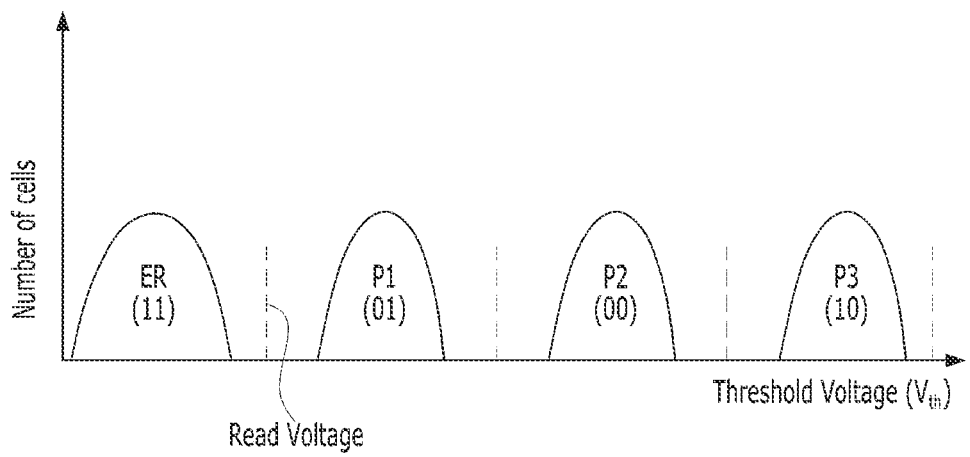
FIG. 3A is a diagram illustrating an example of an ideal cell voltage level distribution of a non-volatile memory device.
Figure 3B:
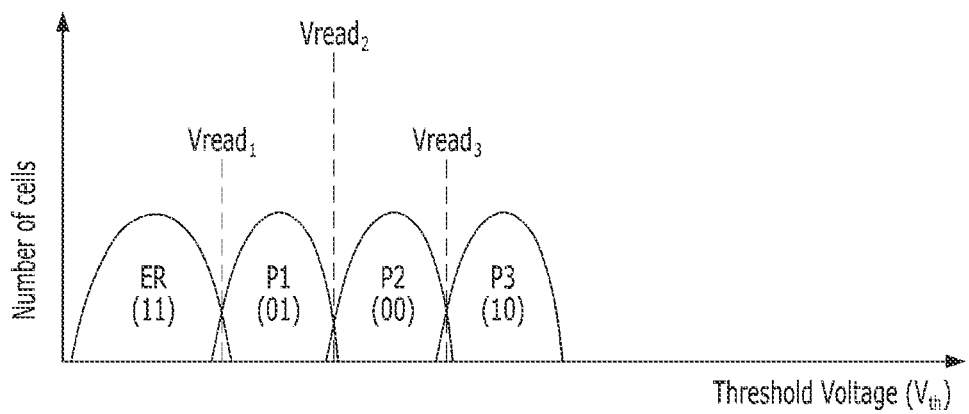
FIG. 3B is a diagram illustrating an example of a shifted cell voltage level distribution of a non-volatile memory device.
Figure 3C:
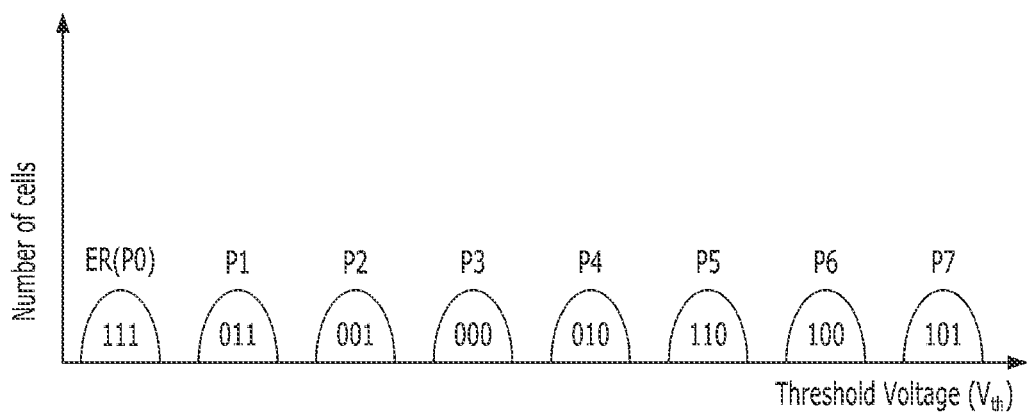
FIG. 3C is a diagram illustrating another example of an ideal cell voltage level distribution of a non-volatile memory device.

FIGS. 3A and 3C illustrate examples of threshold voltage distribution curves in a multi-level cell device, wherein the number of cells for each program/erase state is plotted as a function of the threshold voltage. As illustrated in FIG. 3A, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same wordline are repeatedly programmed using a program-and-verify approach with a stepped-up program voltage applied to wordlines in successive program loops. Each programmed state associates with a verify voltage that is used in verify operations and sets the target position of each threshold voltage distribution window.

Figure 4:
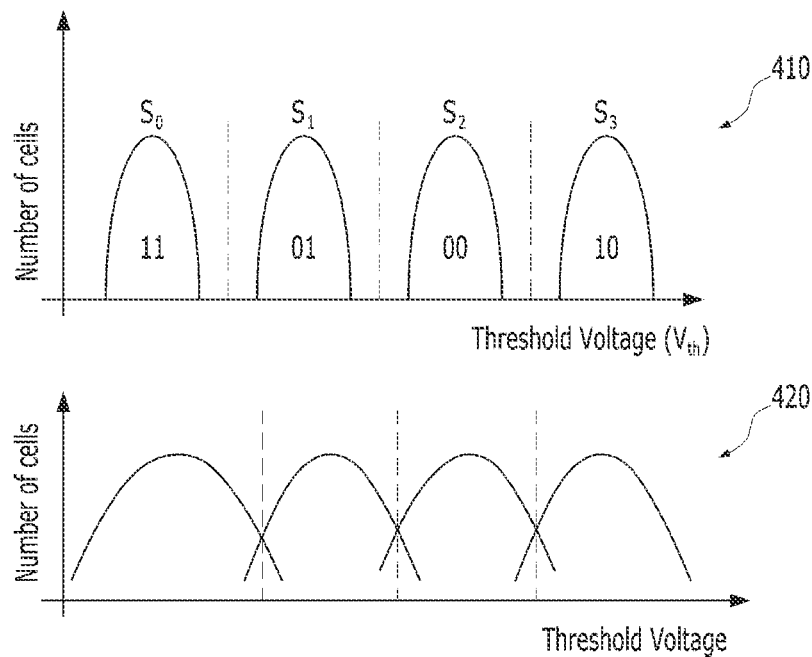
FIG. 4 is a diagram illustrating cell voltage level distributions of a non-volatile memory device.

Read errors can be caused by distorted or overlapped threshold voltage distribution (as illustrated, for example, in FIG. 33). An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC), FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to 2n possible values. In an ideal multi-level cell NAND flash memory, each value corresponds to a non-overlapping threshold voltage window.

Figure 5:
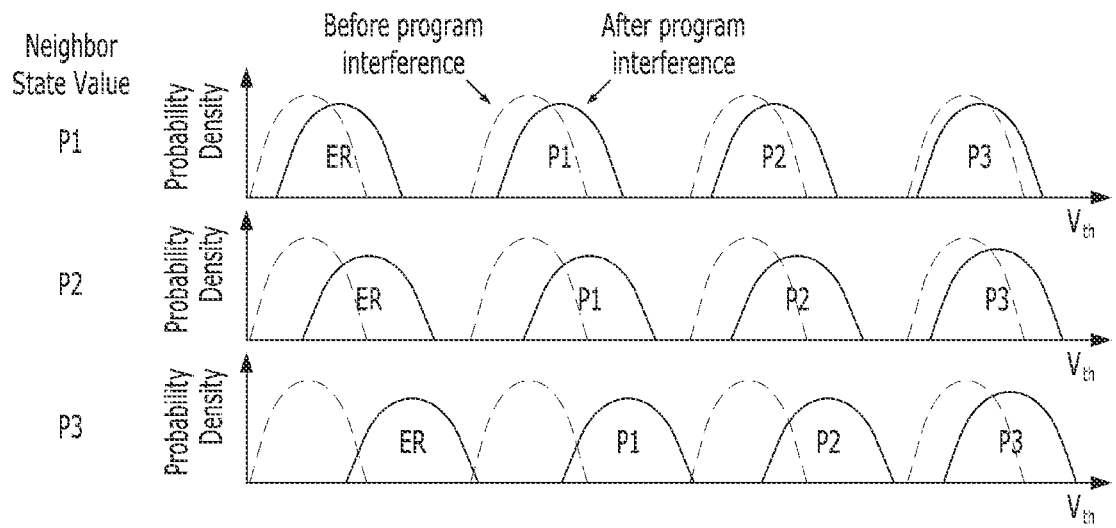
FIG. 5 is a diagram illustrating cell voltage level distribution of a non-volatile memory device before and after program interference.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value, FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bitline structure. In the even/odd bitline structure, memory cells on one wordline are alternately connected to even and odd bitlines and even cells are programmed ahead of odd cells in the same wordline. Therefore, even cells and odd cells experience different amounts of cell-to-cell interference. Cells in all-bitline structure suffer less cell-to-cell inference than even cells in the even/odd bitline structure, and the all-bitline structure can effectively support high-speed current sensing to improve the memory read and verify speed.

The dotted lines in FIG. 5 denote the nominal distributions of PIE states (before program interference) of the cells under consideration, and "neighbor state value" denotes the value to which the neighboring state has been programmed. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
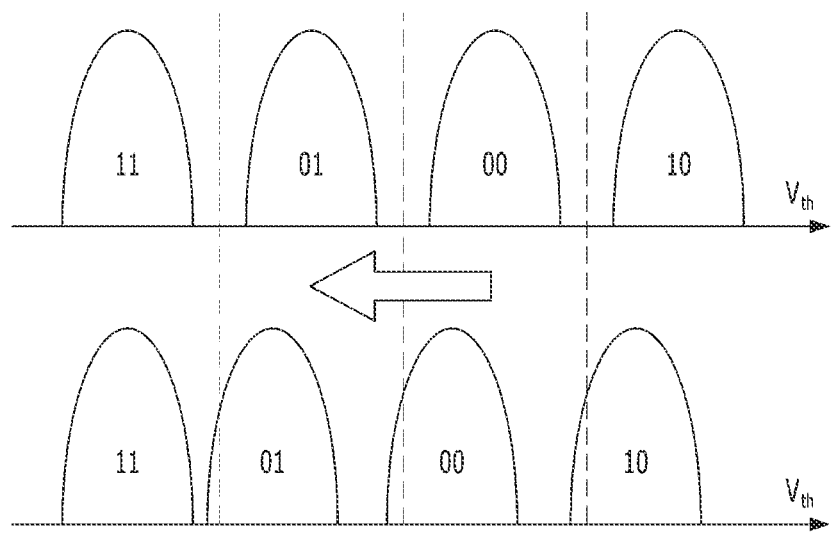
FIG. 6 is a diagram illustrating cell voltage level distribution of a non-volatile memory device as a function of the reference voltage.

FIG. 6 illustrates an example of a retention error in NAND flash memory, comparing a normal threshold-voltage distribution (top) and a shifted threshold-voltage distribution (bottom). The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

Embodiments of the disclosed technology provide techniques which improve the process by which a read threshold is determined and/or inputs which are used to determine a read threshold in the NAND flash memory described in FIGS. 1-6. Improving a read threshold would, for example, reduce the number of read errors and may enable some code words (e.g., which are uncorrectable using an error correction code when a less optimal read threshold is used during the read process) to be decoded (e.g., because the reduced number of read errors now falls within the error correction capability of the code).

As described above, FIG. 3A illustrates an ideal distribution of different program and erase states of a 2-bit MLC memory device as function of threshold voltage. As illustrated therein, the number of cells per state is shown as a function of the threshold voltage ($V_{threshold}$). In an MLC memory device (e.g., an MLC flash memory device capable of storing k-bit data in a single memory cell) the memory cell may have one of $2^k$ threshold voltage distributions. For example, the 2-bit MLC has one of four threshold voltage distributions.

Threshold voltages of memory cells programmed for the same data form the threshold voltage distribution due to characteristic differences between memory cells. In the 2-bit MLC memory device, as illustrated in FIG. 3A, threshold voltage distributions are formed in correspondence with the data states including 3 program states 'P2' and 'P3' and an erase state 'E'. FIG. 3A shows an ideal case in which threshold voltage distributions do not overlap and have sufficient read voltage margins between.

FIG. 3B illustrates a distribution of different program and erase states due to characteristic deterioration of the 2-bit MLC memory device, and as a function of the threshold voltage. As illustrated therein, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 3B, the threshold voltage distribution may be shifted due to charge loss.

Further, program disturbance, erase disturbance and/or back pattern dependency also cause increases in threshold voltages. As characteristics of memory cells deteriorate, neighboring threshold voltage distributions may overlap, as illustrated in FIG. 3B.

Once neighboring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2', When a sensed state of a memory cell according to a read voltage Vread3 applied to a selected word line is off, the memory cell is determined to have a third program state 'P3.' However, when neighboring threshold voltage distributions overlap, a memory cell that has the third program state 'P3' may be erroneously determined to have the second program state 'P2' Said another way, when the neighboring threshold voltage distributions overlap as illustrated in FIG. 3B, read data ay include a number of errors. To assist with reducing the number of errors, threshold voltage for a memory device may be characterized using a polynomial interpolation technique.

Figure 7:
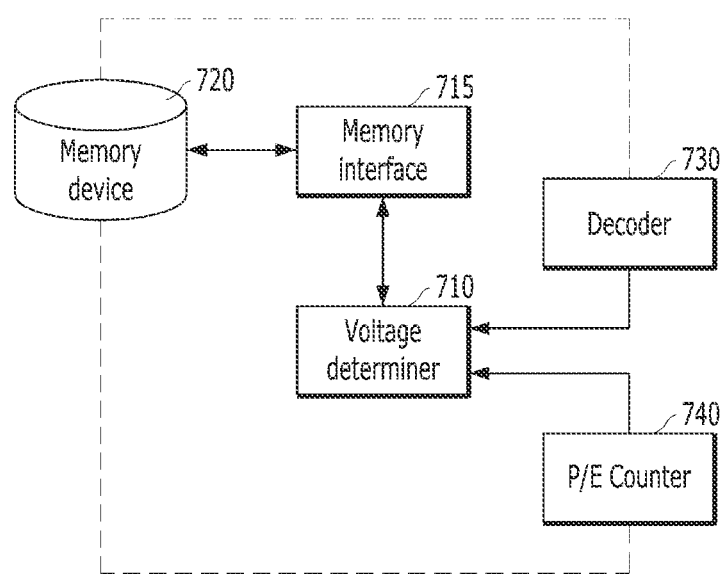
FIG. 7 is a block diagram illustrating an exemplary storage system configured to reliably read information.

FIG. 7 is a block diagram illustrating an exemplary storage system configured to reliably read information. It is to be noted that the diagram of FIG. 7 is simplified to illustrate only some of the components in the storage system, which may include additional components that are not shown. As illustrated in FIG. 7, data is stored on a memory device 720 (e.g., NAND Flash). A memory interface 715 is used to access the data stored on the memory device 720 and takes as input a read threshold and read address(es) and returns the read data. The voltage determiner 710 may determine the optimal read voltage consistent with the teachings herein. The exemplary storage system 700 may further include a decoder 730 and a program/erase (P/E) counter 740, which may be connected to the memory device 720. In some embodiments, some or all of the modules in FIG. 7 are implemented using semiconductor components, such as an application-specific integrated circuit (ASIC) or a field-programmable gate array (FPGA).

In some embodiments, the data that is read from the memory device 720 by the memory interface 715 is passed to the decoder 730, which is configured to determine whether or not the codewords read from the memory device 720 can be correctly decoded. In an example, if the codewords are not decoded correctly, the voltage determiner 710 may be instructed to generate another read voltage. In some embodiments, the decoder 730 performs an error correction decoding on the codewords using an error correction code (e.g., a low density parity check (LDPC) code or another systematic code with parity symbols (which may be either bits or non-binary symbols)).

Figure 8:
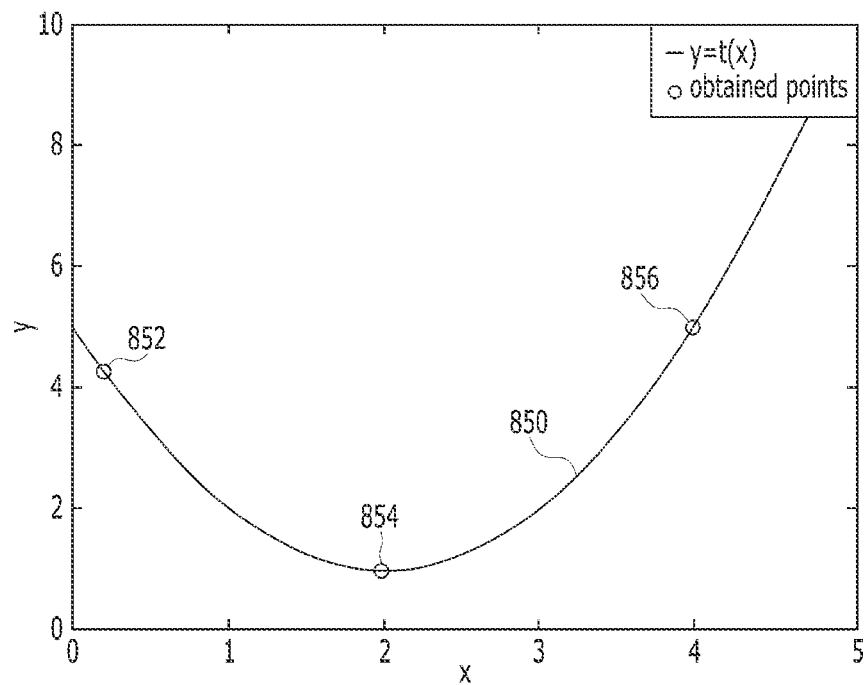
FIG. 8 illustrates an example of a polynomial interpolation for a quadratic function.

FIG. 8 illustrates an example of a polynomial interpolation for a quadratic function, $y=f(x)=a_0+a_1x+a_2x^2$, where the threshold voltage distribution between two states $S_i$ and $S_{i+1}$ has been modeled by the parabola 850 illustrated therein. In this example illustrated in FIG. 8, a=($a_0$, $a_1$, $a_2$)=(5, −4,1). Polynomial interpolation has been used in existing implementations to determine an optimal read voltage in scenarios similar to those illustrated in FIG. 3B, where neighboring threshold voltage distributions have overlapped due to degradation of the cells of the memory device.

In the example illustrated in FIG. 8, the parameters ($a_0$, $a_1$, $a_2$) are estimated by first obtaining three data points, e.g., ($x_1$, $y_1$) 852, ($x_2$, $y_2$) 854, and ($x_3$, $y_3$) 856, where $y_i$ represents the number (or probability density function) of cells and $x_i$ represents the i-th threshold voltage that is read, and then solving the equation:

$$\begin{bmatrix} y_0 \\ y_1 \\ y_2 \end{bmatrix} = \begin{bmatrix} 1 & x_0 & x_0^2 \\ 1 & x_1 & x_1^2 \\ 1 & x_2 & x_2^2 \end{bmatrix} \begin{bmatrix} a_0 \\ a_1 \\ a_2 \end{bmatrix}.$$

In general, for polynomial interpolations, if there are m parameters, then m+1 values (or pairs of measurements) are used to estimate the parameters. The above linear equation can be represented as: y=Xa.

Herein, $$y = \begin{bmatrix} y_0 \\ y_1 \\ y_2 \end{bmatrix}, X = \begin{bmatrix} 1 & x_0 & x_0^2 \\ 1 & x_1 & x_1^2 \\ 1 & x_2 & x_2^2 \end{bmatrix} \text{ and } a = \begin{bmatrix} a_0 \\ a_1 \\ a_2 \end{bmatrix}.$$

Once the parameters ($a_0$, $a_1$, $a_2$) have been estimated, the optimal read voltage level is determined as:

$$x_{opt} = -\frac{a_1}{2a_2}.$$

Herein, the optimal read voltage satisfies $$\frac{dy}{dx} = 0,$$

where $y = a_0 + a_1 x + a_2 x^2$.

Figure 9A:
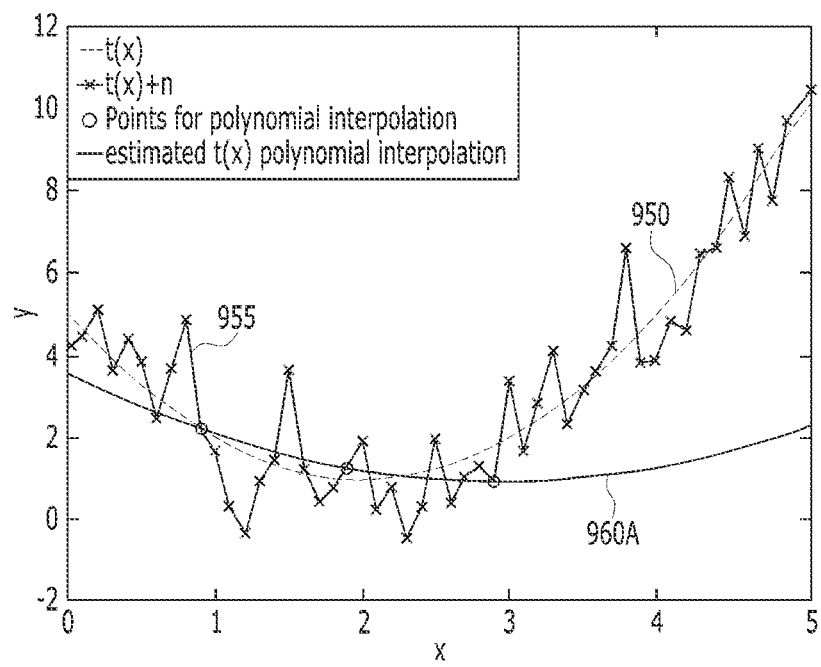
FIG. 9A illustrates an example of a polynomial interpolation of a noisy quadratic function.
Figure 9B:
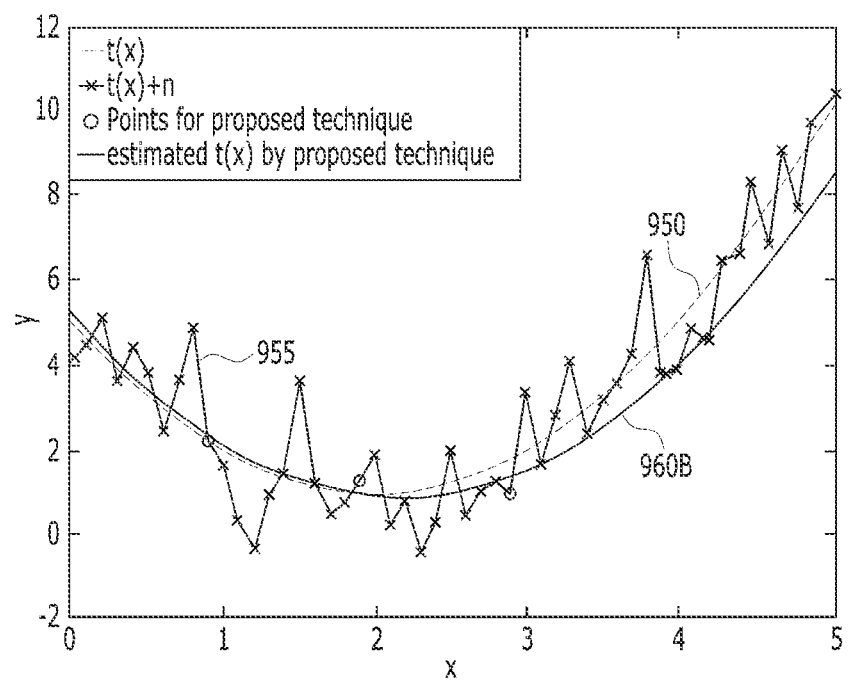
FIG. 9B illustrates an example of a least squares regression of a noisy quadratic function.

However, polynomial interpolation is not robust to noise, which is demonstrated using the example shown in FIGS. 9A and 9B, which illustrates a comparison of a polynomial interpolation and a least squares regression, respectively, of a noisy quadratic function. As illustrated therein, the original parabolic function 950 is perturbed by noise (e.g., additive white Gaussian noise (AWGN)) resulting in a noisy parabolic function 955. FIG. 9A illustrates the result 960A of the polynomial interpolation described above, which is clearly a poor fit to the original parabolic function 950.

Embodiments of the disclosed technology, among other features and benefits, improve the robustness of the parameter estimation to noise, and instead of using polynomial interpolation, are based on the least mean square framework. In an example, the least mean square method uses four points, and is represented as:

$$\begin{bmatrix} y_1 \\ y_2 \\ y_3 \\ y_4 \end{bmatrix} = \begin{bmatrix} 1 & x_0 & x_0^2 \\ 1 & x_1 & x_1^2 \\ 1 & x_2 & x_2^2 \\ 1 & x_3 & x_3^2 \end{bmatrix} \begin{bmatrix} a_0 \\ a_1 \\ a_2 \end{bmatrix}.$$

In some embodiments, the above equation can be expressed as y=Xa, and the parameters can be estimated as:

$$a = (X^T X)^{-1} X^T y.$$

Herein, the superscript T denotes the transpose operation.

FIG. 93 illustrates the result 9603 of the least squares method described above, which is clearly a significantly better fit to the original parabolic function 950 than the result 960A of the polynomial interpolation. Table 1 provides a numerical comparison of the values determined using the polynomial interpolation and the least squares method to the actual values of the parameters and the optimal read voltage.

TABLE 1

Comparison of polynomial interpolation and the least squares method

|  | Original Value | Polynomial Interpolation | Least Squares |
|---|---|---|---|
| a = ($a_0$, $a_1$, $a_2$) | (5, −4, 1) | (3.53, −1.75, 0.30) | (5.23, −4.07, 0.94) |
| $x_{opt}$ | 2 | 2.94 | 2.16 |

In general, and for a polynomial $f(x)$ whose degree is $\deg(f(x)) = m$, the least squares method can estimate the parameters a with N points (N>m+1) using $$a = (X^T X)^{-1} X^T y.$$

Herein, $$y = \begin{bmatrix} y_0 \\ \vdots \\ y_{n-1} \end{bmatrix} \text{ and } X = \begin{bmatrix} 1 & \cdots & x_0^m \\ \vdots & \ddots & \vdots \\ 1 & \cdots & x_{n-1}^m \end{bmatrix}.$$

Note that the least squares method uses at least m+2 points, whereas the polynomial interpolation uses m+1 points.

In some embodiments, and for improved stability, the parameters a may be estimated using a regularized least squares method, which is given by:

$$a = (X^T X + \lambda I)^{-1} X^T y$$

Herein, I is an identity matrix and $\lambda$ is the regularization parameter or coefficient. In an example, the regularization parameter $\lambda$ is a small positive value, which reduces the variance of the estimates a. In some embodiments, the regularization parameter $\lambda$ can be chosen based on the memory device's status such as P/E cycles and retention. In an example, the P/E cycles and retention may be determined using the P/E counter 740 and error correction decoder 730, respectively, as illustrated in FIG. 7.

In other embodiments, the parameters a may be estimated using a modified regularized least squares method, which is given by:

$$a = (X^T X - \bar{\lambda} I)^{-1} X^T y.$$

Herein, $\bar{\lambda}$ is the regularization parameter or coefficient that is less than or equal to zero. That is, the regularization parameter $\bar{\lambda}$ is a small negative value, which reduces the variance of the estimates a.

In some embodiments, instead of estimating the parameter a by the matrix operations, the parameter a can be calculated by an iterative way to reduce the computational complexity. In an example, the iterative algorithm used is shown in Table 2.

TABLE 2

Iterative algorithm for parameter estimation

Parameters: β (step size)
Computation For i = 0,1,2, . . .
  1. Obtain a point ($x_i$, $y_i$) from flash memory
  2.
    Set $x_i = \begin{bmatrix} 1 \\ \vdots \\ x_i^m \end{bmatrix}$ TABLE 2-continued Iterative algorithm for parameter estimation 3. $e_i = y_i - x_i^T a_i$
4. $a_{i+1} = a_i + \beta e_i x_i$
Until stopping criterion is satisfied.

In some embodiments, the described least squares (LS) and regularized least squares (RLS) methods may need more data points to reduce the effect of noise. As discussed previously in the context of FIG. 8, the optimal read voltage is between two states $S_i$ and $S_{i+1}$ and then the candidate read voltage (and specifically, the first read voltage) is between the two states. This preprocessing operation may include a number of read operations, one or more of which can be reused to reduce the effect of noise. In contrast to the existing implementation, based on polynomial interpolation, which does not use the read operations that are part of the preprocessing operation, embodiments of the disclosed technology can use all these initial read operations to reduce the variance of the estimated parameters.

Figure 10:
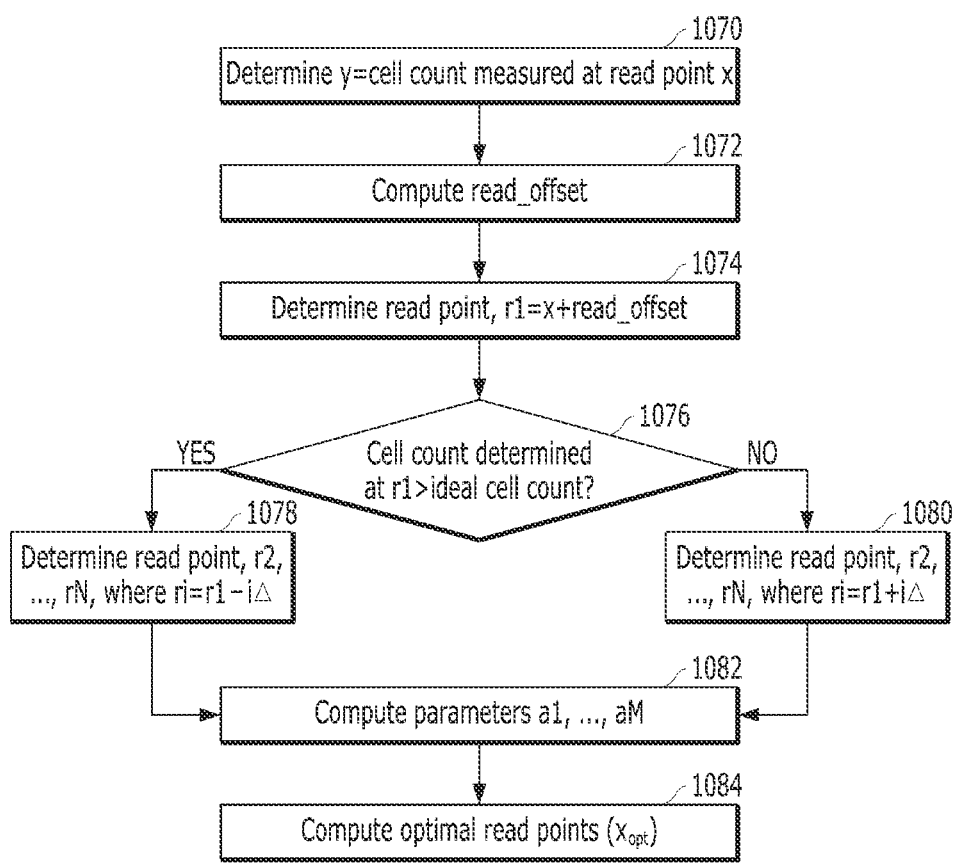
FIG. 10 illustrates a flowchart of a method for improving reliability of retrieving information from a memory device.

FIG. 10 is a flowchart illustrating an exemplary method for reliably reading information in a memory device. The method 1000 includes, at operation 1070, determining the number of cells (represented by a cell count ($\gamma$)) at a read point (x). In order to find the optimal read point, the first read point ($r_1$) has to be within a valley region between two states, and the read_offset can be computed (at operation 1072) using the following proportionality expression:

read_offset=(width of a state)×(y–ideal_cell_count)/ideal_cell_count,

Herein, the ideal_cell_count is the number of cells for a particular read voltage assuming no deterioration in the program and erase states of an MLC memory device (e.g., as illustrated in FIG. 3A). In some embodiments, the ideal_cell_count parameter may be stored in a lookup table. The method 1000 includes, at operation 1074, determining the first read point ($r_1$) as a sum of the original read point and the read_offset, ensuring that the first read point is within the valley region between the two states.

The method 1000 includes, at operation 1076, comparing the cell count determined at the first read voltage point ($r_1$) to the ideal cell count. If the cell count determined at the first read point is greater than the ideal cell count, at operation 1078 an additional read is performed by subtracting a delta ($\Delta$) from the first read point until threshold$_1$. This process continues until threshold$_1$ is reached. That is, the subsequent read points (r2, ... rN) are determined by repeatedly subtracting $\Delta$ from the previous read point (first read point r1 for r2) until a predetermined first threshold (threshold$_1$) is reached. Similarly, if the cell count determined at the first read point is less than ideal cell count, at operation 1080 an additional reads are performed by successively adding a delta ($\Delta$) to the previous read point until a second threshold (threshold$_2$) is reached. In an example, the read voltage step-size $\Delta$, threshold$_1$ and threshold$_2$ are parameters, which are defined experimentally.

The method 1000 includes, at operation 1082, computing the parameters ($a_1, a_2, \ldots, a_M$) using the (x, y) value pairs from the N read points ($r_1, r_2, \ldots, r_N$), and then computing the optimal read point (at operation 1084). In some embodiments, the optimal read point may be offset by a predetermined offset value, which may be determined experimentally.

Figure 11:
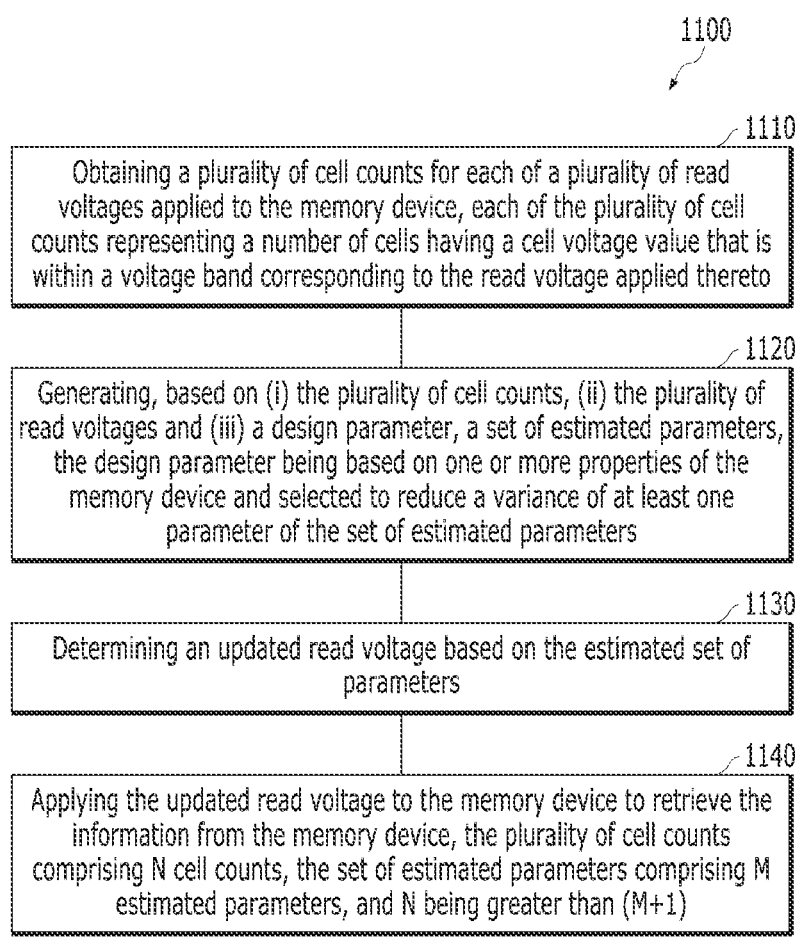
FIG. 11 illustrates a flowchart of another method for improving reliability of retrieving information from a memory device.

FIG. 11 is a flowchart illustrating another exemplary method for reliably reading information in a memory device.

The method 1100 includes, at operation 1110, obtaining a plurality of cell counts for each of a plurality of read voltages applied to the memory device, each of the plurality of cell counts representing a number of cells having a cell voltage value that is within a voltage band corresponding to the read voltage applied thereto.

The method 1100 includes, at operation 1120, generating, based on (i) the plurality of cell counts, (ii) the plurality of read voltages and (iii) a design parameter, a set of estimated parameters, the design parameter being based on one or more properties of the memory device and selected to reduce a variance of at least one parameter of the set of estimated parameters.

The method 1100 includes, at operation 1130, determining an updated read voltage based on the estimated set of parameters.

The method 1100 includes, at operation 1140, applying the updated read voltage to the memory device to retrieve the information from the memory device, the plurality of cell counts comprising N cell counts, the set of estimated parameters comprising M estimated parameters, and N being greater than (M+1).

In some embodiments, the generating is based on a regularized least squares, and the design parameter is a non-negative regularization parameter.

In some embodiments, the plurality of cell counts is denoted ($y_0, y_1, \ldots, y_{N-1}$) and the plurality of read voltages is denoted ($x_0, x_1, \ldots, x_{N-1}$), the set of parameters is denoted ($a_0, a_1, \ldots, a_{M-1}$), the non-negative regularization parameter is denoted $\lambda$, the estimated set of parameters $\tilde{a}$ is given by $\tilde{a}=(X^TX+\lambda I)^{-1}X^Ty$, I is an M×M identity matrix and T denotes a transpose operation, $\tilde{a}=[a_0, a_1, \ldots, a_{M-1}]^T$ and $y=[y_0, y_1, \ldots, y_{N-1}]^T$, $$X = \begin{bmatrix} 1 & x_0 & x_0^2 & \cdots & x_0^{M-1} \\ \vdots & \vdots & \vdots & \ddots & \vdots \\ 1 & x_{N-1} & x_{N-1}^2 & \cdots & x_{N-1}^{M-1} \end{bmatrix},$$

N=3, M=2, and the updated read voltage is given by $-a_1/(2a_2)$.

In some embodiments, the generating excludes a matrix inversion operation and is based on an iterative computation and a stopping criterion.

In some embodiments, a first of the plurality of read voltages ($x_0$) is greater than a first read voltage of a first state and less than a second read voltage of a second state, and the method 1100 further comprises the operation of comparing a first of the plurality of cell counts ($y_0$) to an ideal cell count.

In some embodiments, the method further comprises the operations of determining that $y_0$ is greater than the ideal cell count, and setting $x_i = x_0 - i\Delta$ for $i=1, \ldots, N-1$, wherein $\Delta$ is a predetermined parameter.

In some embodiments, the method further comprises the operations of determining that $y_0$ is less than the ideal cell count, and setting $x_i = x_0 + i\Delta$ for $i=1, \ldots, N-1$, wherein $\Delta$ is a predetermined parameter.

In some embodiments, the one or more properties of the memory device comprise a number of program/erase (PE) cycles and/or a retention parameter.

Figure 12:
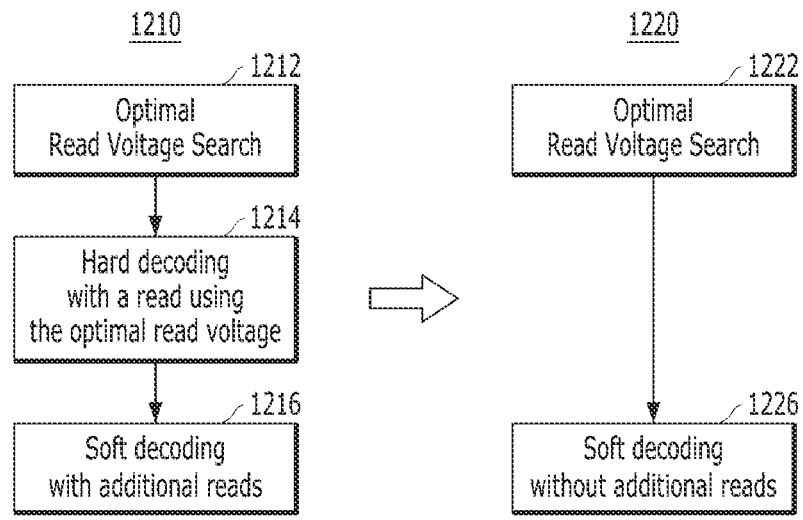
FIG. 12 is a diagram illustrating an algorithm for an optimal read voltage search and soft decoding in accordance with an embodiment of the present invention.

FIG. 12 is a diagram illustrating algorithms for an optimal read voltage search and decoding.

Referring to FIG. 12, an algorithm 1210 may be used for in a memory system (e.g., NAND-based memory system such as a solid state drive (SSD)). Memory systems may perform a decoding operation in accordance with the algorithm 1210, using an error correction code (e.g., a low-density parity check (LDPC) code) to decode data (i.e., codeword), which are read from a memory device. First, the algorithm 1210 may perform a hard decoding (HD) 1214. The hard decoding 1214 may decode data, which are read through a read operation performed using a set read voltage. In other words, the hard decoding 1214 may determine data pattern, i.e., distinguish whether data is a value of 1 or a value of 0. The set read voltage may be an optimal read voltage, which are found through an optimal read voltage search 1212. When the hard decoding 1214 failed, soft decoding (SD) 1216 may be performed. The soft decoding 1216 may classify data into different data patterns using log-likelihood ratio (LLR) values. In order to get different LLR values, the soft decoding 1216 may perform additional read operations using additional read voltages, some greater than the optimal read voltage and others less than the optimal read voltage.

As such, because the hard decoding uses only one read voltage, the latency of the hard decoding is low, but its error correction capability tends to be poor. In contrast, the latency of soft decoding is high because it uses additional read voltages, but its error correction capability is much higher than hard decoding. Accordingly, it is desirable to provide a system and a method for reducing latency of soft decoding while retaining its high error correction capability. Embodiments provide an algorithm 1220, which includes an optimal read voltage search 1222 and soft decoding 1226 without additional reads. The algorithm 1220 may perform the soft decoding 1226 without additional reads during the optimal read voltage search 1222, thus improving latency and error correction capability.

One implementation of the optimal read voltage search 1222 has a structure as shown in FIG. 7 and performs operations as shown in FIGS. 8 to 11. Such a structure is described in U.S. patent application Ser. No. 16/707,381, entitled "ROBUST DETECTION TECHNIQUES FOR MEMORY DEVICES" and incorporated by reference herein.

In some embodiments, the optimal read voltage search 1222 may estimate the set of parameters a=($a_0$, $a_1$, $a_2$) by using the least square method (LSM) based on four points and estimate an optimal read voltage based on the set of parameters. The lease square method is described with reference to FIG. 9B.

Figure 13:
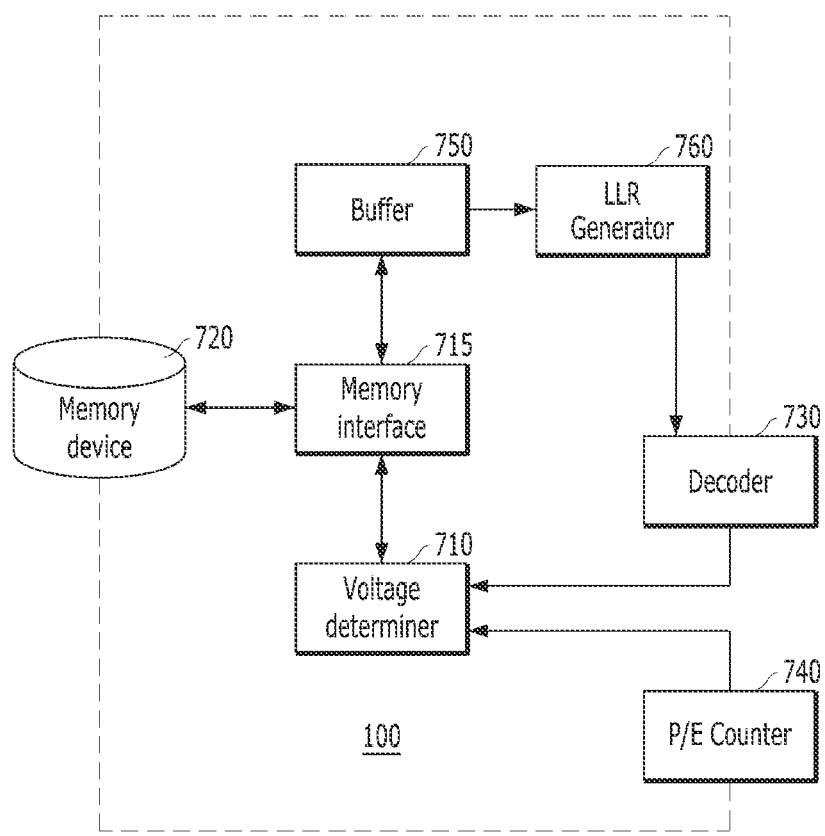
FIG. 13 is a diagram illustrating a memory system for an algorithm for an optimal read voltage search and soft decoding in accordance with an embodiment of the present invention.

FIG. 13 is a diagram illustrating a memory system for an algorithm for an optimal read voltage search and soft decoding in accordance with an embodiment of the present invention.

Referring to FIG. 13, the memory system may include a memory device 720 and components of a controller 100. The controller 100 may include a voltage determiner 710, a memory interface 715, a decoder 730 and a program and erase (P/E) counter 740, as shown in FIG. 7. Further, the memory controller may include a buffer 750 and a log-likelihood ratio (LLR) generator 760. These components may be implemented with internal components of the control component 120 (i.e., firmware (FW)) in FIG. 1B. The buffer 750 and the LLR generator 760 may be implemented as internal components of the decoder 730. Although not shown in FIG. 13, the controller 100 and the memory device 72 may include various other components as shown in FIG. 1B.

The voltage determiner 710 may determine a plurality of read voltages for read operations on a plurality of cells in the memory device 720. The voltage determiner 710 may provide information regarding each of the plurality of read voltages to the memory device 720 through the memory interface 715.

The memory interface 715 may receive information regarding each read voltage from the voltage determiner 710 and provide the received information regarding the read voltage, a read command and a read address to the memory device 720. In response to the read command, the memory device 720 may apply the read voltage to memory cells, which correspond to the read address. In other words, the memory device 720 may perform a read operation on the memory cells and output data corresponding to the read operation.

Referring back to FIG. 1B, the voltage generation circuit 230 may generate the read voltage corresponding to the received information. The row decoder 240 may apply the read voltage to a selected word line which are coupled with memory cells, according to control of the control circuit 220. The page buffer 250 may sense current formed as memory cells are turned on and off in response to the read voltage, and may acquire data corresponding to the memory cells, according to sensing results. The page buffer 250 may transmit the acquired data to the controller 100 through the column decoder 260 and the input/output circuit 270.

Referring back to FIG. 13, the memory interface 715 may receive, from the memory device 720, corresponding read data which are associated with the read operation using each of the plurality of read voltages. Further, the memory interface 715 may provide the read data to the buffer 750 to be stored. The buffer 750 may store the obtained read data associated with each of the plurality of read voltages. The LLR generator 760 may generate LLR values using the obtained data. The decoder 730 may perform soft decoding using the LLR values. The voltage determiner 710 may estimate a set of parameters based on the least mean square method and estimate an optimal read voltage based on the set of parameters, in accordance with the optimal read voltage search described above.

In accordance with embodiments, the controller 100 may obtain, from the memory device 720, several data point pairs ($x_n$, $y_n$) through the optimal read voltage search. Herein, $x_n$ are a read bias point (or voltage) and $y_n$ are the number of cells corresponding to the read bias point $x_n$. For example, data point pairs ($x_1$, $y_1$), ($x_2$, $y_2$), and ($x_3$, $y_3$) may be obtained. When a read operation is performed using the read voltage $x_n$, $y_n$ and corresponding data $data_n$ may be obtained. The buffer 750 may store data $data_n$ as data $buffer_n$.

Figure 14A:
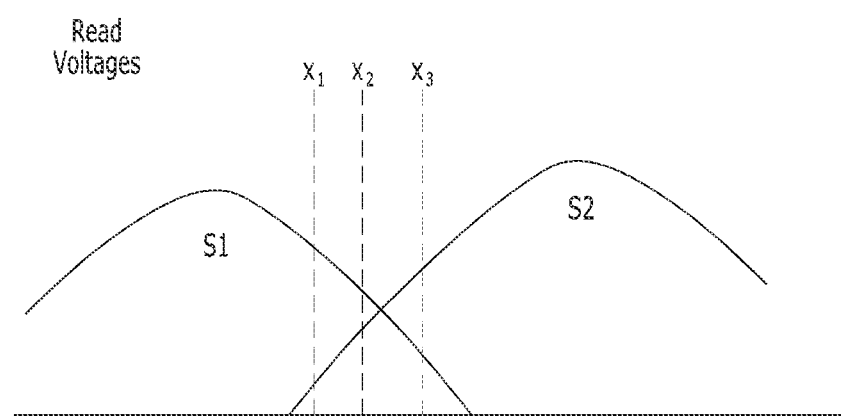
FIGS. 14A and 14B are diagrams illustrating examples of an operation for generating log-likelihood ratio (L R) values in accordance with an embodiment of the present invention.

The controller 100 may preprocess data stored in the buffer 750, i.e., data points ($x_n$, $buffer_n$) in order to generate LLR values. Herein, $buffer_n$ represents data stored in the buffer 750, which corresponds to the read voltage $x_n$. The preprocess operation means the operation to get one data points ($x_n$, $buffer_n$) and save data on the data points onto a memory for finding the optimal read bias. Through this preprocessing, data points may be symmetrically or asymmetrically on the both sides of the optimal read point. A difference (i.e., delta) between a read voltage and another read voltage may be different. For example, the difference between $x_1$ and $x_2$ and the difference between $x_2$ and $x_3$ may be different. These data may be used to generate LLR values because they all are placed around valley point (i.e., optimal read point or voltage) between two states S1, S2, as shown in FIG. 14A.

Figure 14B:
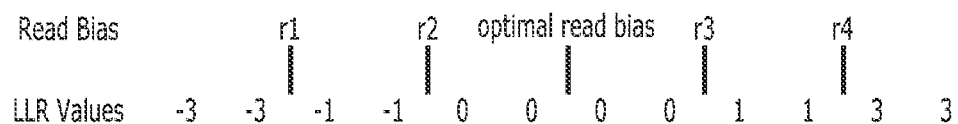

With these data stored on the buffer 750, the LLR generator 760 may generate different LLR values. As illustrated in FIG. 14B, the LLR generator 760 may generate different LLR values using multiple read biases (or read voltages) including an optimal read bias and read biases r1 to r4. The LLR generator 760 may generate LLR values (0,0) using the optimal read bias and read biases r1 to r4, generate LLR values (−3, −1) using the read bias r1, generate LLR values (−1,0) using the read bias r2, generate LLR values (0,1) using the read bias r3, and generate LLR values (1,3) using the read bias r4. The decoder 730 may perform soft decoding to decode data (or codeword) using the generated LLR values. As such, embodiments may combine the optimal read voltage search and the soft decoding without any additional reads. Embodiments reuse data which are obtained during finding the optimal read voltage first and then performs soft decoding using data obtained through the optimal read voltage search. In other words, embodiments find the optimal read voltage and perform soft decoding at substantially the same time. In contrast, the conventional scheme performs hard decoding and soft decoding individually, and the conventional scheme does not store any data of data points ($x_n$, $buffer_n$) and does not utilize any data from hard decoding. Further, the conventional soft decoding uses additional reads to generate LLR values after finding the optimal read threshold. That is, the conventional scheme performs soft decoding from the scratch (i.e., it takes a long because it need a lot read operations to generate LLR values).

Figure 15:
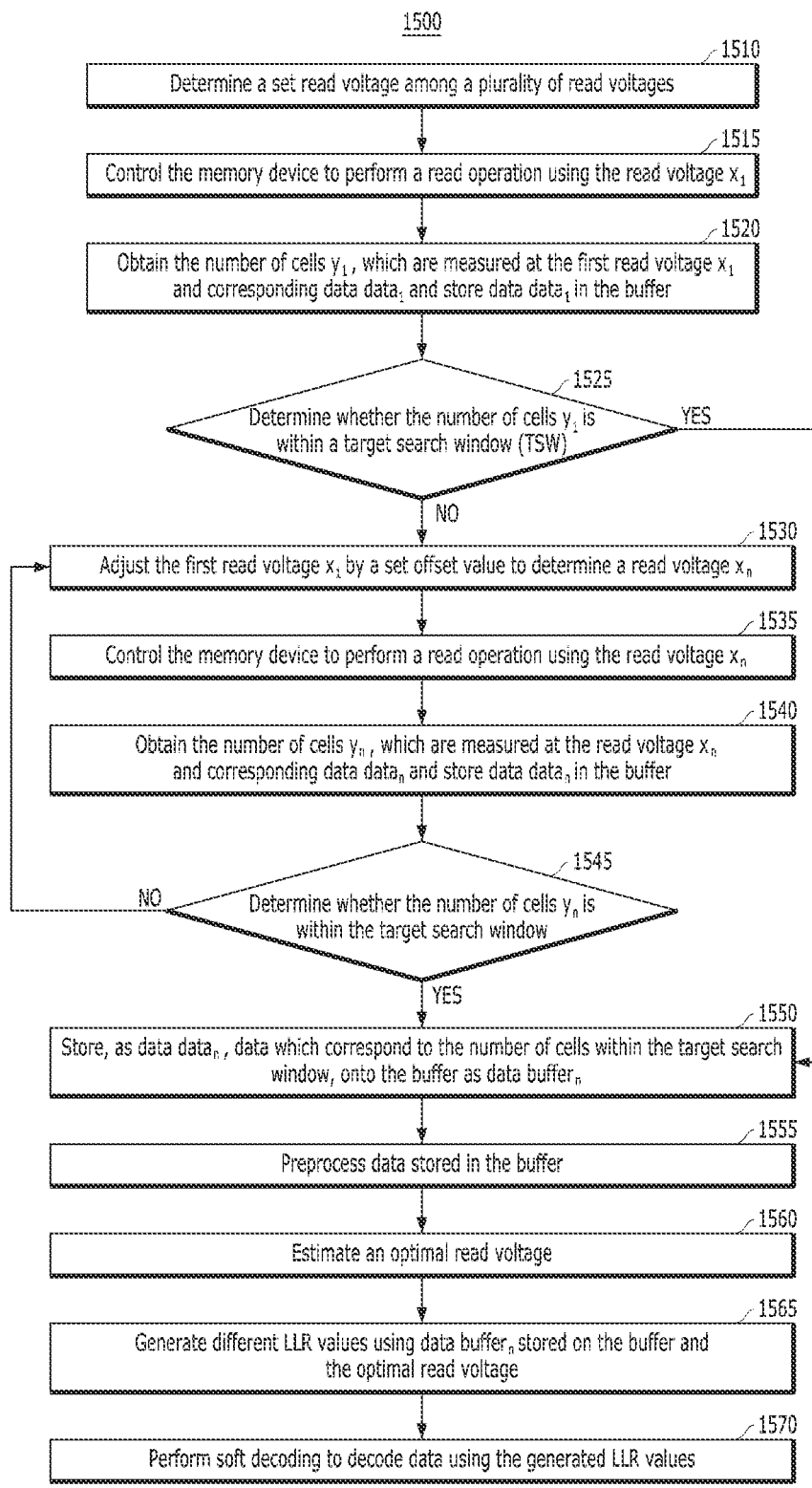
FIG. 15 is a flowchart illustrating an operation for soft decoding based on an optimal read voltage search in accordance with an embodiment of the present invention.

FIG. 15 is a flowchart illustrating an operation 1500 for soft decoding based on an optimal read voltage search in accordance with an embodiment of the present invention. The operation 1500 may be performed by components of the controller 100 in FIG. 13. In FIG. 15, $x_n$ are a read bias point (or voltage), $y_n$ are the number of cells determined at the read voltage $x_n$ and $buffer_n$ represents data stored in the buffer 750, which corresponds to the read voltage $x_n$.

Referring to FIG. 15, at operation 1510, the controller 100 may determine a set read voltage among a plurality of read voltages (e.g., a first read voltage $x_1$ among read voltages $x_1$ to $x_3$ in a matrix associated with the least mean square method above). At operation 1515, the controller 100 may control the memory device 720 of FIG. 13 to perform a read operation using the read voltage $x_1$. At operation 1520, the controller 100 may obtain the number of cells $y_1$, which are determined at the first read voltage $x_1$ and corresponding data $data_1$ and store data $data_1$ in the buffer 750.

Figure 16:
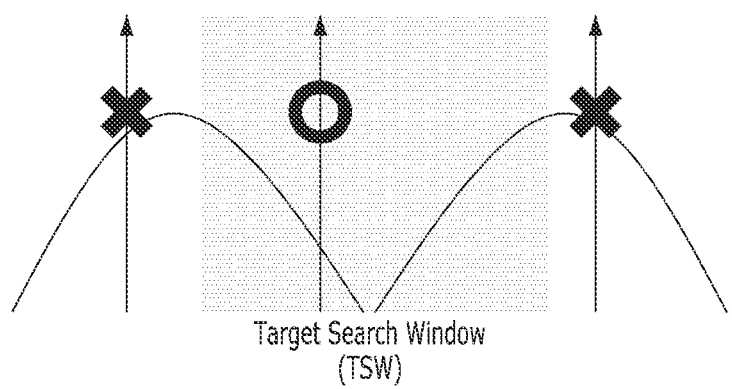
FIG. 16 is a diagram illustrating a target search window in accordance with an embodiment of the present invention.

At operation 1525, the controller 100 may determine whether the number of cells $y_1$ is within a target search window (TSW). For example, the controller 100 may determine whether the number of cells $y_1$ is within the target search window using two reference values, one of which defines the start of the target search window and the other defines the end of the target search window. In some embodiments, as illustrated in FIG. 16, the target search window may be the range (or valley) between the peak of program voltages (or program verification voltages) $PV_n$ and $PV_{n+1}$. When it is determined that the number of cells $y_1$ is within the target search window, the controller 100 may proceed to perform operation 1550. When it is determined that the number of cells $y_1$ is out of the target search window, the controller 100 may proceed to perform operation 1530.

At operation 1530, the controller 100 may adjust the first read voltage $x_1$ by a set offset value to determine a read voltage $x_n$. For example, the controller 100 may increase the first read voltage $x_1$ by the set offset value when the number of cells $y_1$ is less than the first reference value of the target search window. In this case, the second read voltage $x_2$ may be determined, which corresponds to an addition of the first read voltage $x_1$ and the offset. For another example, the controller 100 may decrease the set read voltage $x_1$ by the set offset value when the number of cells $y_1$ is greater than the second reference value of the target search window. In this case, the second read voltage $x_2$ may be determined, which corresponds to a subtraction of the offset from the first read voltage $x_1$.

At operation 1535, the controller 100 may control the memory device 720 of FIG. 13 to perform a read operation using the read voltage $x_n$. At operation 1540, the controller 100 may obtain the number of cells $y_n$, which are determined at the read voltage $x_n$ and corresponding data $data_n$ and store data $data_n$ in the buffer 750.

At operation 1545, the controller 100 may determine whether the number of cells $y_n$ is within the target search window. Until it is determined that the number of cells is within the target search window, operations 1535, 1540 may be performed iteratively.

At operation 1550, the controller 100 may store, as data $data_n$, data which correspond to the number of cells within the target search window, onto the buffer 750 as data $buffer_n$.

At operation 1555, the controller 100 may preprocess data stored in the buffer 750, i.e., data points ($x_n$, $buffer_n$) in order to generate LLR values.

At operation 1560, the controller 100 may estimate an optimal read voltage. In some embodiments, the optimal read voltage may be performed using the least mean square method, as described above. In other words, the controller 100 may determine a set of parameters, based on (i) the plurality of read voltages, (ii) a plurality of cell counts corresponding to the plurality of read voltages and (iii) a non-negative regularization parameter which is based on one or more properties of the memory device and is selected to reduce a variance of at least one parameter of the set of parameters, and estimate the optimal read voltage based on the set of parameters.

At operation 1565, the controller 100 may generate different LLR values using data $buffer_n$ stored on the buffer 750 and the optimal read voltage. At operation 1570, the controller 100 may perform soft decoding to decode data (or codeword) using the generated LLR values.

As described above, embodiments provide a scheme for performing soft decoding without additional reads during an optimal read voltage search. Embodiments thus improve latency and error correction capability.

Although various embodiments have been illustrated and described in some detail for purposes of clarity and understanding, the present invention is not limited to any embodiment nor to any specific details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device including a plurality of cells; and
   a controller configured to:
   apply each of a plurality of read voltages to the plurality of cells to obtain a corresponding cell count and corresponding data;
   store the obtained data associated with the plurality of read voltages;
   process the stored data;
   determine a set of parameters, based on (i) the plurality of read voltages, (ii) the cell counts corresponding to the plurality of read voltages and (iii) a non-negative regularization parameter which is based on one or more properties of the memory device and is selected to reduce a variance of at least one parameter of the set of parameters;
estimate an optimal read voltage based on the set of parameters;
generate log-likelihood ratio (LLR) values using the processed data and the optimal read voltage; and
perform soft decoding using the LLR values.

2. The memory system of claim 1, wherein the plurality of cell counts comprises N cell counts, the set of parameters comprises M parameters, N and M are positive integers, and N is greater than (M+1),
wherein the plurality of cell counts is denoted ($y_0$, $y_1$, ..., $y_{N-1}$) and the plurality of read voltages is denoted ($x_0$, $x_1$, ..., $x_{N-1}$), the set of parameters is denoted ($a_0$, $a_1$, ..., $a_{M-1}$), the non-negative regularization parameter is denoted $\lambda$, and the set of parameters $\tilde{a}$ is given by $\tilde{a}=(X^T X+\lambda I)^{-1} X^T y$,
wherein $\tilde{a}=[a_0, a_1, ..., a_{M-1}]^T$ and $y=[y_0, y_1, ..., y_{N-1}]$, wherein $$X = \begin{bmatrix} 1 & x_0 & x_0^2 & \cdots & x_0^{M-1} \\ \vdots & \vdots & \vdots & \ddots & \vdots \\ 1 & x_{N-1} & x_{N-1}^2 & \cdots & x_{N-1}^{M-1} \end{bmatrix},$$

wherein I is an M×M identity matrix and T denotes a transpose operation, and wherein N=3, M=2 and the optimal read voltage is determined by $-a_1/(2a_2)$.

3. The memory system of claim 1, wherein the one or more properties of the memory device comprise a number of program/erase (PE) cycles or a retention parameter.

4. The memory system of claim 1, wherein the controller stores the obtained data in a buffer when the corresponding cell count is within a target search window.

5. The memory system of claim 4, wherein the controller
obtains a first cell count and first data corresponding to a first read voltage among the plurality of read voltages;
determines whether the first cell count is within the target search window; and
when it is determined that the first cell count is within the target search window, stores the first data in the buffer.

6. The memory system of claim 5, wherein the controller
when it is determined that the first cell count is out of the target search window, determines a second read voltage among the plurality of read voltages, the second read voltage corresponding to an addition of the first read voltage and a set offset or a subtraction of the set offset from the first rad voltage;
obtains a second cell count and second data corresponding to the second read voltage;
determines whether the second cell count is within the target search window; and
when it is determined that the second cell count is within the target search window, stores the second data in the buffer.

7. The memory system of claim 6, wherein the controller
generates a first LLR value using the first data or the second data; and
generates a second LLR value using the optimal read voltage.

8. A method for operating a memory system, which includes a memory device including a plurality of cells and a controller, the method comprising:

applying each of a plurality of read voltages to the plurality of cells to obtain a corresponding cell count and corresponding data;
storing the obtained data associated with the plurality of read voltages;
processing the stored data;
determining a set of parameters, based on (i) the plurality of read voltages, (ii) the cell counts corresponding to the plurality of read voltages and (iii) a non-negative regularization parameter which is based on one or more properties of the memory device and is selected to reduce a variance of at least one parameter of the set of parameters;
estimating an optimal read voltage based on the set of parameters;
generating log-likelihood ratio (LLR) values using the processed data and the optimal read voltage; and
performing soft decoding using the LLR values.

9. The method of claim 8, wherein the plurality of cell counts comprises N cell counts, the set of parameters comprises M parameters, N and M are positive integers, and N is greater than (M+1),
wherein the plurality of cell counts is denoted ($y_0$, $y_1$, ..., $y_{N-1}$) and the plurality of read voltages is denoted ($x_0$, $x_1$, ..., $x_{N-1}$), the set of parameters is denoted ($a_0$, $a_1$, ..., $a_{M-1}$), the non-negative regularization parameter is denoted $\lambda$, and the set of parameters $\tilde{a}$ is given by $\tilde{a}=(X^T X+\lambda I)^{-1} X^T y$,
wherein $\tilde{a}=[a_0, a_1, ..., a_{M-1}]^T$ and $y=[y_0, y_1, ..., y_{N-1}]^T$, wherein $$X = \begin{bmatrix} 1 & x_0 & x_0^2 & \cdots & x_0^{M-1} \\ \vdots & \vdots & \vdots & \ddots & \vdots \\ 1 & x_{N-1} & x_{N-1}^2 & \cdots & x_{N-1}^{M-1} \end{bmatrix},$$

wherein I is an M×M identity matrix and T denotes a transpose operation, and wherein N=3, M=2 and the optimal read voltage is determined by $-a_1/(2a_2)$.

10. The method of claim 8, wherein the one or more properties of the memory device comprise a number of program/erase (PE) cycles or a retention parameter.

11. The method of claim 8, wherein the storing includes:
storing the obtained data in a buffer when the corresponding cell count is within a target search window.

12. The method of claim 11, wherein the applying includes obtaining a first cell count and first data corresponding to a first read voltage among the plurality of read voltages,
wherein the storing includes:
determining whether the first cell count is within the target search window; and
when it is determined that the first cell count is within the target search window, storing the first data in the buffer.

13. The method of claim 12, further comprising:
when it is determined that the first cell count is out of the target search window, determining a second read voltage among the plurality of read voltages, the second read voltage corresponding to an addition of the first read voltage and a set offset or a subtraction of the set offset from the first rad voltage;
obtaining a second cell count and second data corresponding to the second read voltage;
determining whether the second cell count is within the target search window; and when it is determined that the second cell count is within the target search window, storing the second data in the buffer.

14. The method of claim 13, wherein the LLR values include:
 a first LLR value generated using the first data or the second data; and
 a second LLR value generated using the optimal read voltage.

\* \* \* \* \*